United States Patent
Bewlay et al.

(10) Patent No.: US 9,721,044 B2
(45) Date of Patent: Aug. 1, 2017

(54) SYSTEMS AND METHODS FOR NON-DESTRUCTIVE EVALUATION OF MOLDS AND CRUCIBLES USED IN INVESTMENT CASTING

(71) Applicant: GENERAL ELECTRIC COMPANY, Schenectady, NY (US)

(72) Inventors: Bernard Patrick Bewlay, Niskayuna, NY (US); Jonathan Sebastian Janssen, Niskayuna, NY (US); Christopher Allen Nafis, Niskayuna, NY (US); Clifford Bueno, Niskayuna, NY (US); Krzysztof Lesnicki, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 1111 days.

(21) Appl. No.: 13/891,624

(22) Filed: May 10, 2013

(65) Prior Publication Data
US 2014/0336806 A1    Nov. 13, 2014

(51) Int. Cl.
*G06F 19/00* (2011.01)
*G06F 17/50* (2006.01)
(Continued)

(52) U.S. Cl.
CPC .............. *G06F 17/50* (2013.01); *G01B 11/24* (2013.01); *G01B 21/04* (2013.01); *G01B 21/20* (2013.01)

(58) Field of Classification Search
CPC ........ G01B 11/24; G01B 21/20; G01B 21/04; G06F 17/50
See application file for complete search history.

(56) References Cited

U.S. PATENT DOCUMENTS 4,352,060 A * 9/1982 Garpendahl ....... G01R 27/2605
324/662
5,848,115 A * 12/1998 Little ................... G01N 23/046
378/4
(Continued)

FOREIGN PATENT DOCUMENTS

EP      1674822 A1    6/2006
EP      2233248 A1    9/2010
(Continued)

OTHER PUBLICATIONS

Thomas Tone, "3D Scanners: Laser versus White Light" Dec. 2011, LMI Technologies, pgs. 1-2.*
(Continued)

*Primary Examiner* — Michael D Masinick
(74) *Attorney, Agent, or Firm* — John P. Darling

(57) ABSTRACT

Systems for non-destructive evaluation (NDE) of molds and crucibles used in investment casting processes include a support, a 3D scanning device, and a computer component. Methods for non-destructive evaluation include providing a system for non-destructive evaluation of a mold or crucible; securing a mold or crucible to the support of the system; and operating the 3D scanning device of the system in conjunction with the computer component in order to create a 3D structure difference map that indicates whether the mold or crucible falls within or outside a desired structural integrity parameter range.

2 Claims, 16 Drawing Sheets

(51) Int. Cl.
*G01B 21/04* (2006.01)
*G01B 21/20* (2006.01)
*G01B 11/24* (2006.01)

(56) References Cited

U.S. PATENT DOCUMENTS

| | | |
|---|---|---|
| 7,824,730 B2 | 11/2010 | Ruglio et al. |
| 2002/0170699 A1 | 11/2002 | McDonald |
| 2007/0195311 A1* | 8/2007 | Morgan ............... G01B 15/04 356/124 |
| 2008/0250659 A1* | 10/2008 | Bellerose ............ G05B 19/402 33/1 MP |
| 2008/0290569 A1* | 11/2008 | Bewlay ................ C22B 9/003 266/275 |
| 2012/0263866 A1 | 10/2012 | Melzer-Jokisch et al. |

FOREIGN PATENT DOCUMENTS

| | | |
|---|---|---|
| JP | 07270134 A | 10/1995 |
| JP | 10185545 A | 7/1998 |
| JP | 11173834 A | 9/1999 |
| JP | 2001083415 A | 3/2001 |
| JP | 2003344026 A | 12/2003 |

OTHER PUBLICATIONS

PCT Search Report and Written Opinion issued in connection with corresponding Application No. PCT/US2014/037276 on Sep. 1, 2014.

Marvin Klein & Tim Bodenhamer; "Measuring wall thickness in seamless tube, cast-iron pipe: lasers meet ultrasonics," TPJ—The Tube & Pipe Journal, Mar. 2005, Journal 16.2, pp. 22-25.

Yuelin Xu, Kun Bu, Dinghua Zhang, Shengli Huang, Yunyong Cheng, Rui Suo; "Algorithm for calculation of wall thickness for hollow turbine blade wax-patterns with inscribed circle chord length," Hangkong Xuebao/Acta Aeronautica et Astronautica Sinica, 2011, vol. 32, No. 2, pp. 344-350.

Japanese Search Report issued in connection with corresponding JP Application No. 2016-513063 dated Nov. 28, 2016.

Office Action issued in connection with corresponding JP Application No. 2016-513063 on Dec. 6, 2016.

* cited by examiner

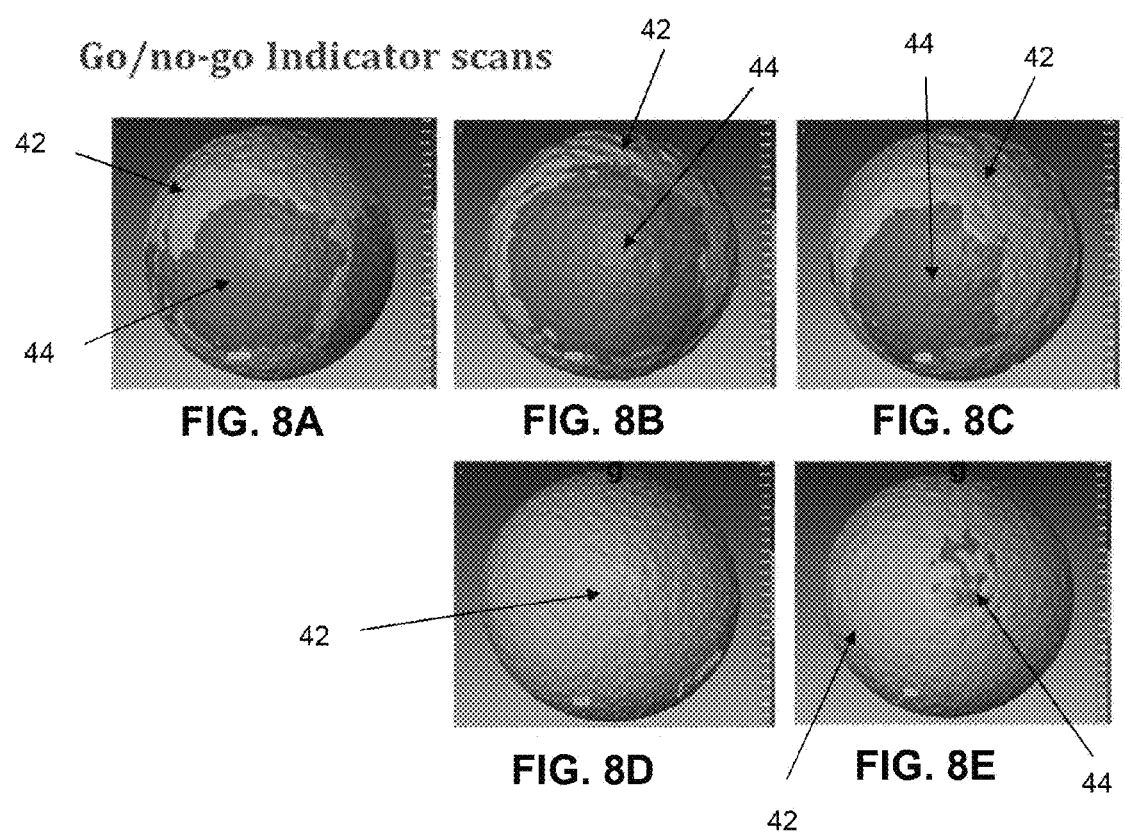

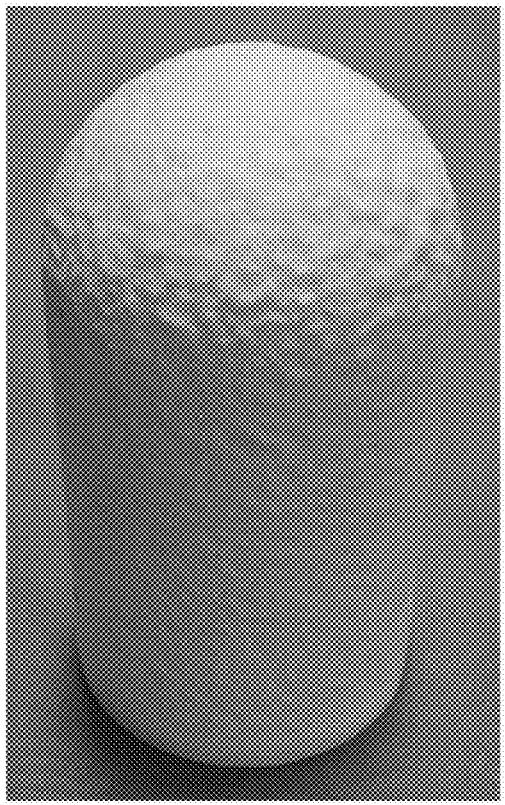 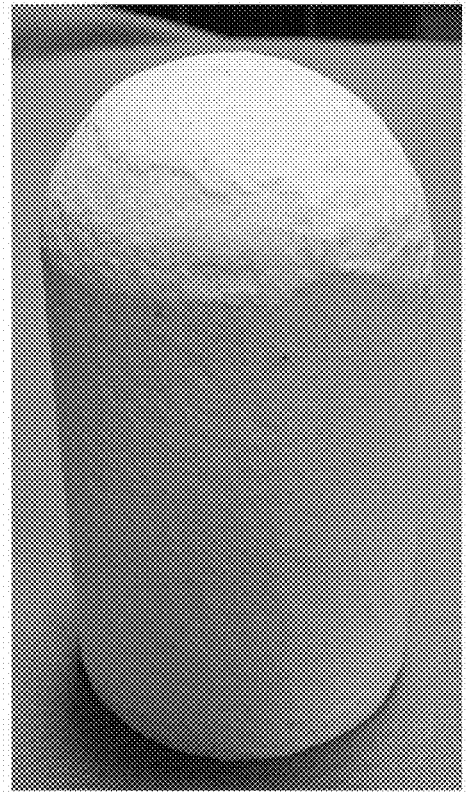
Accepted     Rejected
FIG. 12A     FIG. 12B

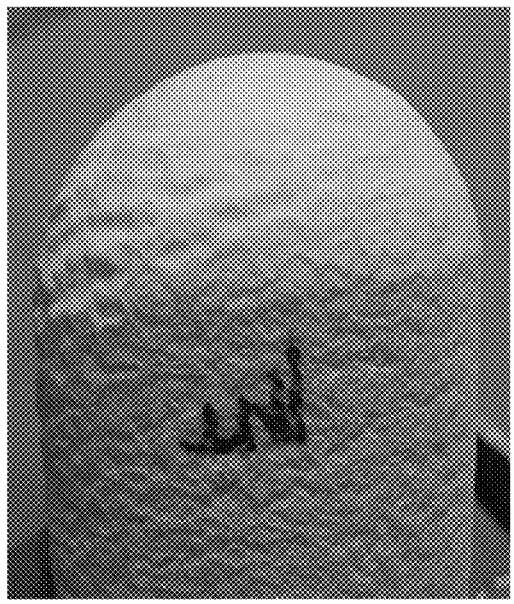 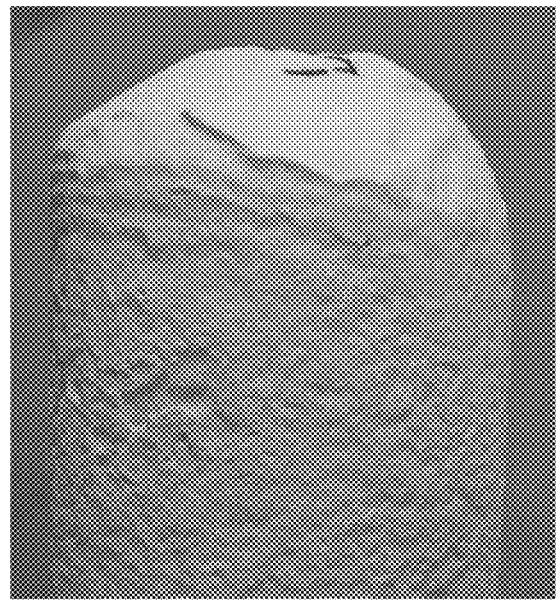
Rejected                    Rejected
FIG. 13A                FIG. 13B

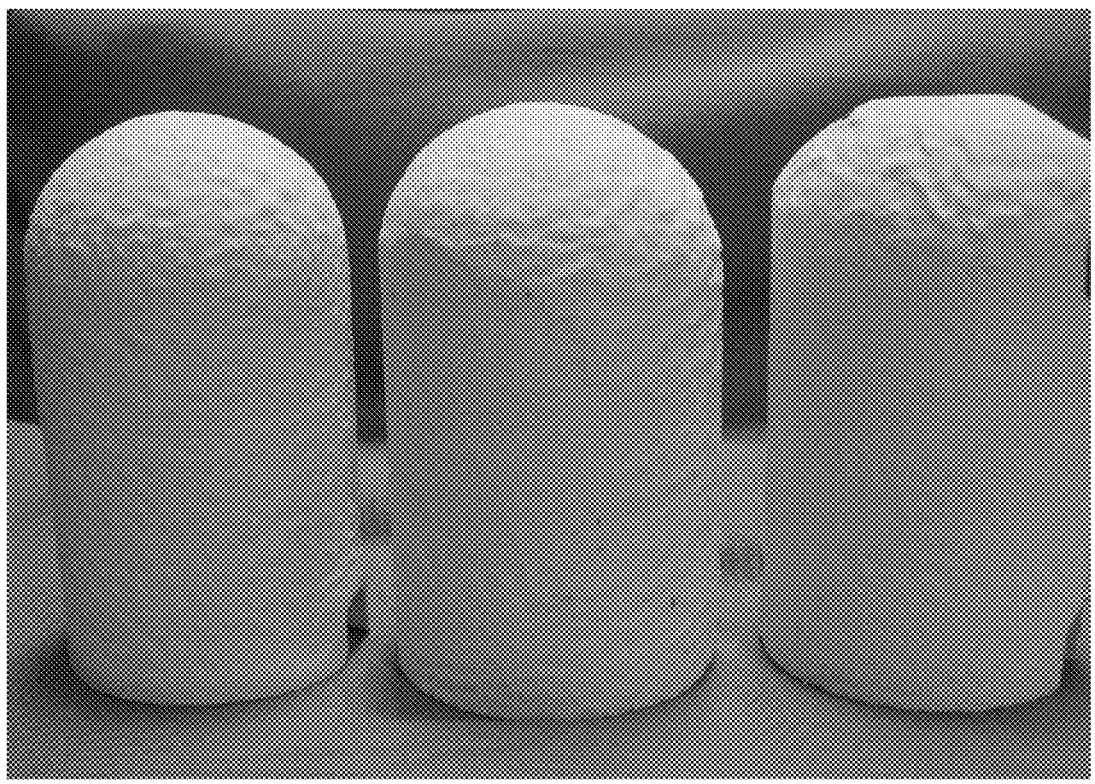
Accepted　　　Rejected　　　Rejected
FIG. 14A　　FIG. 14B　　FIG. 14C

Nominal Model of a Crucible

SYSTEMS AND METHODS FOR NON-DESTRUCTIVE EVALUATION OF MOLDS AND CRUCIBLES USED IN INVESTMENT CASTING

BACKGROUND

The present disclosure relates to systems and methods useful for non-destructive evaluation (NDE) of molds and crucibles used in investment casting processes, including, without limitation, for producing aircraft engines, land-based turbine engines, and the like.

Molds and crucibles are commonly used in making components and parts for high performance devices such as aircraft and land-based turbine engines. Uniformity and structural integrity of such molds and crucibles are important in maintaining quality control in investment casting processes. Control of the full volume geometry and the wall thickness of investment casting molds and crucibles is important to ensure structural integrity of the mold or crucible and to prevent leaks occur during melting and casting. X-ray technology has been used to analyze the structural integrity of molds and crucibles. However, such X-ray techniques require highly specialized personnel and equipment, and generally more time-consuming than is permissible for a manufacturing environment. Therefore, there remains a need for practical techniques for inspecting the full volume geometry or wall thickness of a mold or crucible in a non-destructive manner prior to melting and casting.

The thickness of the wall is important because it has a major effect on the strength of the ceramic shell component. For example, if the thickness of the wall of the ceramic shell component falls below a minimum threshold value, the strength of the component falls below the minimum acceptable strength, and the liquid metal can leak from the crucible or mold. In some cases this leakage can result in a casting failure. Accordingly, wall thickness is a critical parameter of melting crucibles and casting molds, as thickness below a specification limit increase the likelihood of part loss during the casting operation.

There are current practices to check the wall thickness of crucibles. One current practice is to sample crucibles on a low-frequency basis. The measurement process involves installing the crucible into a fixture with point contacts on the internal face. Measurements are made with a dial indicator on or about points on the surface. After these measurements are made, the crucible must be discarded because the point-contacts damage the contacting surface of the crucible.

Induction melting generally involves heating a metal in a crucible made from a non-conductive refractory alloy oxide until the charge of metal within the crucible is melted to liquid form (see, e.g., U.S. Pat. No. 8,048,365 to Bewlay et al.). When melting highly reactive metals such as titanium or titanium alloys, vacuum induction melting using cold wall or graphite crucibles can be employed instead of oxide based ceramic crucibles. Difficulties can arise when melting highly reactive alloys, such as titanium alloys, as a result of the reactivity of the elements in the alloy at the temperatures used for melting. While most induction melting systems use refractory oxides for crucibles in the induction furnace, alloys such as titanium aluminide are so highly reactive that they can attack the refractory oxides present in the crucible and the titanium alloy becomes contaminated. For example, ceramic crucibles are typically avoided because the highly reactive alloys can react with the crucible and contaminate the alloy, with oxygen for example. Similarly, if graphite crucibles are employed, both the titanium and titanium aluminide based alloys can dissolve carbon from the crucible into the titanium alloy, thereby resulting in contamination and loss of mechanical properties of the resulting article.

Cold crucible melting offers advantages for processing highly reactive alloys, but it also has a number of technical and economic limitations, including low superheat, yield losses due to skull formation, high power requirements, and limited melt capacity. Any reaction between the molten alloy and the crucible will tend to deteriorate the properties of the casting. The deterioration can be as simple as poor surface finish due to gas bubbles, or worse, the chemistry, microstructure, and properties of the casting can be compromised.

Accordingly, it is important to have inspection techniques in place to ensure the production of high quality crucibles for use in melting the metal or metal alloy. In one example, the inspection techniques are applied to ceramic crucibles used for highly reactive alloys, as the ceramic crucibles are less susceptible to contamination and pose fewer technical and economic limitations than current techniques. For example, rather than destructive sampling based inspection techniques, there is a need for inspection technologies that are non-destructive so as to preserve yields and that are effective to enable fast and efficient inspection.

The present systems and methods are directed to overcoming these and other deficiencies in the art.

SUMMARY

The present disclosure relates to systems and methods useful for non-destructive evaluation (NDE) of molds and crucibles used in investment casting processes, including, without limitation, for use in producing components for aircraft engines, land-based turbine engines, and the like.

According to one aspect, the present disclosure provides a system for non-destructive evaluation of a mold or crucible. The system includes a support, a three-dimensional (3D) scanning device, and a computer component. The support comprises a fixture for securing a mold or crucible of interest in place for non-destructive evaluation, with the fixture comprising a mount portion onto which the mold or crucible is secured. The 3D scanning device is effective for scanning an outer surface of a target region of the mold or crucible in order to generate a 3D structure of the scanned outer surface of the target region. The computer component is operably connected to the 3D scanning device and effective to create a difference map between the 3D structure of the scanned outer surface of the target region of the mold or crucible and a 3D structure of a reference object corresponding to an inner surface of a nominal model of the same target region of the mold or crucible. The difference map indicates whether the mold or crucible falls within or outside a desired structural integrity parameter range. In one embodiment, the support further comprises a locating mechanism for positioning the mold or crucible in a repeatable orientation on the support and maintaining the mold or crucible in that orientation during scanning of the outer surface of the target region of the mold or crucible. In another embodiment, the system further comprises a robotic apparatus for placing the mold or crucible on the support and for removing the mold or crucible from the support.

According to another aspect, the present disclosure provides a method for non-destructive evaluation of a mold or crucible. This method involves the steps of: providing a system for non-destructive evaluation according to the present disclosure; securing a mold or crucible to the support of the system; and operating the 3D scanning device in conjunction with the computer component of the system in order to create a 3D structure difference map that indicates whether the mold or crucible falls within or outside a desired structural integrity parameter range. The 3D structure difference map shows deviations between a 3D structure generated by scanning an outer surface of a target region of the mold or crucible while secured on the support of the system and a 3D structure of a reference object corresponding to an inner surface of a nominal model of the same target region of the mold or crucible. In one embodiment, the support of the system further comprises a locating mechanism for positioning the mold or crucible in a repeatable orientation on the support and maintaining the mold or crucible in that orientation during scanning of the outer surface of the target region of the mold or crucible. In another embodiment, the method further involves using a robotic apparatus for placing the mold or crucible on the support and for removing the mold or crucible from the support.

As provided herein, the present disclosure provides a unique system and a method for measuring the wall thickness of ceramic shell mold and crucible components for use in casting applications. The thickness of the wall of the mold or crucible is important because it has a major effect on the strength of the ceramic shell component. For example, if the thickness of the wall of the ceramic shell component falls below a minimum critical value, the strength of the component falls below the minimum acceptable strength, and the liquid metal can leak from the crucible or mold; the leakage results in a casting failure. If the thickness of the wall of the ceramic shell component falls above a maximum critical value, the component is likely to be improperly located in the casting equipment and require destructive post-processing methods such as external grinding to bring the outer geometry back into specification. Such a step is a non value-added step in a manufacturing process and would contribute to waste and additional cost. Furthermore, a larger wall thickness may result in providing a larger thermal mass of the shell component, which could result in a change of the melting or solidification dynamics of the casting process.

Hence, the ability to inspect in a non-destructive manner the thickness of the wall of the ceramic shell component prior to use in the casting application provides the ability to increase casting yields by elimination of the potential failure in the actual casting operation. The NDE capability allows inspection of the full volume of the ceramic component, unlike other techniques, such as sectioning or using coordinate measuring machine (CMM) technologies, which only provide data of a limited portion of the geometry.

These and other objects, features, and advantages of the systems and methods of the present disclosure will become apparent from the following detailed description of the various aspects of the present disclosure taken in conjunction with the accompanying drawings.

BRIEF DESCRIPTION OF THE DRAWINGS

FIG. 3A shows the crucible prior to placement on the fixture of the support of the system of the present disclosure. FIG. 3B shows the fixture and the locating mechanism of the support prior to securing the crucible to the support. FIG. 3C shows the crucible mounted on the fixture and held in place by the locating mechanism of the support.

FIGS. 8A-8E are illustrations showing go or no-go dispositions for crucible domes analyzed for wall thickness according to embodiments of the system and method of the present disclosure. These illustrations would be provided by a computer component or printout of results for immediate feedback to the operator.

FIGS. 12A-12B are images of crucibles exhibiting an acceptable (FIG. 12A) wall thickness and a rejected (FIG. 12B) wall thickness as determined by embodiments of the system and method of the present disclosure.

FIGS. 13A-13B are images of crucibles exhibiting a rejected wall thickness as determined by embodiments of the system and method of the present disclosure.

FIGS. 14A-14C are images of crucibles exhibiting an acceptable (FIG. 14A) wall thickness and a rejected (FIGS. 14B and 14C) wall thickness as determined by embodiments of the system and method of the present disclosure.

DETAILED DESCRIPTION

Figure 1:
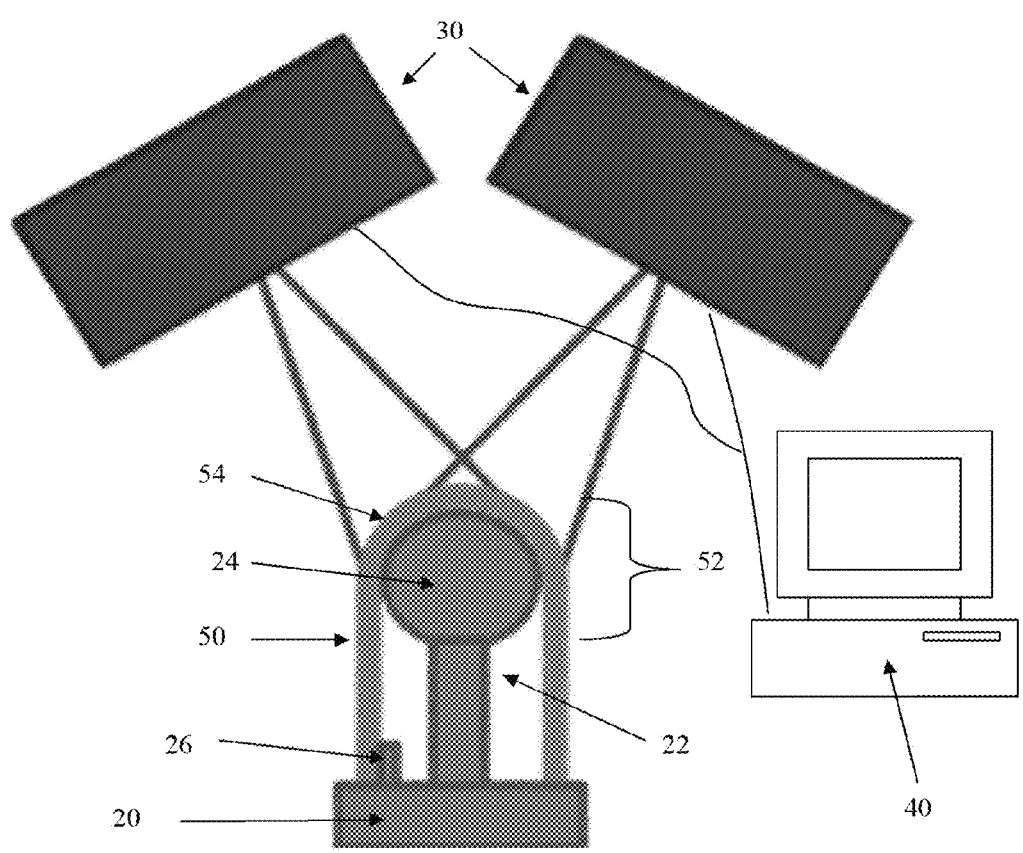
FIG. 1 is a schematic of one embodiment of a system for non-destructive evaluation (e.g., wall thickness) of a mold or crucible according to the present disclosure. The schematic shows the basic components of one embodiment, including two laser scanning heads, a central datum reference geometry (i.e., mount portion 24), and the geometry of interest (i.e., crucible 50). In the case of the figure a crucible 50 is shown for the geometry of interest, but this geometry may be of any type. Further, the system may comprise one or a plurality of laser scanning heads to perform the operation. Such details are to be determined by the geometry and quality requirements of the ceramic shell component of interest.

In general, the systems and methods of the present disclosure are effective for the non-destructive evaluation (NDE) of molds and crucibles, such as determining their wall thickness uniformity, conformance to nominal model requirements, and the like. For example, in certain embodiments, the present disclosure provides a combined electronic and mechanical system that performs surface metrology of shell molds and crucible parts to non-destructively measure wall thickness. Further, the present disclosure provides innovative systems and methods that can be employed to improve casting yield. In a particular embodiment, the system includes: a single or a plurality of three-dimensional (3D) scanning devices (e.g., 3D light or optical scanners) that pass over the shell surface of a crucible; a rigid frame; a fixture that is shaped to the desired internal geometry of the part; and an electronic control, datalogging, and inspection display that provides an operator with the part's disposition (e.g., Accept, Reject, or Rework) based on the laser scanning result, and without destroying or damaging the crucible.

System for Non-Destructive Evaluation of Molds and Crucibles

According to one aspect, the present disclosure provides a system for non-destructive evaluation of a mold or crucible. The system includes a support, a three-dimensional (3D) scanning device, and a computer component. The support comprises a fixture for securing a mold or crucible of interest in place for non-destructive evaluation, with the fixture comprising a mount portion onto which the mold or crucible is secured. The 3D scanning device (e.g., a white light or laser scanner) is effective for scanning an outer surface of a target region of the mold or crucible in order to generate a 3D structure (e.g., a point cloud) of the scanned outer surface of the target region. The computer component is operably connected to the 3D scanning device and effective to create a difference map between the 3D structure of the scanned outer surface of the target region of the mold or crucible and a 3D structure of a reference object corresponding to an inner surface of a nominal model of the same target region of the mold or crucible. The difference map indicates whether the mold or crucible falls within or outside a desired structural integrity parameter range.

In one embodiment, the 3D scanning device, in operable connection with the computer component, is effective to scan the mount portion of the fixture and/or the fugitive pattern of the mold or crucible in order to generate the 3D structure of the reference object.

As used herein, the term "nominal model" refers to a computerized 3D representation of a desired mold or crucible in terms of 3D geometric dimensions. For example, a nominal model is a computerized rendition of the desired mold or crucible that is to be produced. The systems and processes of the present disclosure are suitable for determining whether or not a particular mold or crucible fits the desired nominal model 3D geometric dimensions.

As used herein, the term "reference object" refers to any tangible or computerized object that can be used to provide the 3D structure corresponding to the desired inner surface of the nominal model used for creating the difference map with the 3D structure of the scanned outer surface of the target region of the mold or crucible. For example, the reference object can be the mount portion of the fixture of the support of the system of the present disclosure, a fugitive pattern of the mold or crucible, or a computer aided design (CAD) model of the inner surface of a nominal model of the mold or crucible. When the CAD model is the reference object, such CAD model can also be the nominal model as defined herein.

In certain embodiments, the surface of the mount portion can be scanned with the 3D scanning device to generate 3D structure of the nominal model for the desired inner surface of the crucible or mold. In other embodiments, a fugitive pattern (e.g., a wax or plastic crucible pattern) can be scanned to produce the 3D structure of the nominal model that corresponds to the desired inner surface of the crucible or mold. In addition, the same fugitive pattern may be used in a process for making the crucible or mold according to processes known in the art. In other embodiments, the 3D structure of the nominal model of the desired inner surface of the crucible or mold may be a CAD model.

As used herein, the term "3D structure" refers to a three-dimensional representation of a scanned structure or a nominal model. For example, the 3D structure may be in the form of a point cloud, polygonal model or structure, non-uniform rational basis spline (NURBS) surface or structure, and the like.

As used herein, the "target region" of the mold or crucible refers to a portion or all of the mold or crucible. For example, in some embodiments, the target region can be the dome of the crucible, the sidewalls of the crucible, or the entire crucible (including both the dome and sidewalls of the crucible). In certain embodiments, the target region can be just a portion of the dome of the crucible or a portion of the sidewall of the crucible. In certain embodiments, the target region can be multiple portions of the mold or crucible. For example, the target region can be one or more portions of the dome, one or more portions of the sidewall, or one or more portions of both the dome and sidewall of the crucible.

As used herein, a "structural integrity parameter" refers to any measurable parameter that can be used to determine the structural integrity of a mold or crucible suitable for use in an investment casting process. For example, as used herein, one example of a structural integrity parameter can include, without limitation, wall thickness of a portion or all of the mold or crucible. More particularly, uniformity of wall thickness of a portion or all of the mold or crucible is an example of a structural integrity parameter as used herein. For certain molds or crucibles, uniformity of wall thickness at particular portions of the mold or crucible may be of more importance than at other portions, as can be determined by one of ordinary skill in the relevant art. In certain embodiments, the structural integrity parameter is effective to determine the amount of stress that the mold or crucible will be able to withstand during a particular investment casting process. For example, in one embodiment, the structural integrity parameter can be one that identifies molds or crucibles that have a yield strength of up to 200 Mega Pascal (MPa). Therefore, the system of the present disclosure is effective for stress management of molds or crucibles used in investment casting processes.

As used herein, a "desired structural integrity parameter range" refers to an acceptable range of any measurable parameter that can be used to determine the structural integrity of a mold or crucible suitable for use in an investment casting process, as determined by one of ordinary skill in the art. For example, a desired structural integrity parameter range can be defined by an upper and lower limit of the wall thickness of a portion or all of a mold or crucible. More particularly, the desired structural integrity parameter range can refer to the desired wall thickness of the mold or crucible, or to a percentage of the wall of the mold or crucible that falls within the upper and lower limit of the acceptable range of wall thickness. As provided herein, the desired structural integrity parameter range can be used to determine whether a mold or crucible has an accepted disposition, a rejected disposition, or a rework disposition. Examples of crucibles found to have either an accepted or rejected disposition using the system of the present disclosure are illustrated in the photographs of FIGS. 12A-12B, 13A-13B, and 14A-14C.

As used herein, "non-destructive evaluation" (NDE) refers to a process for evaluating a mold or crucible for its structural integrity (e.g., for a particular structural integrity parameter), where the process causes no or substantially no structural or functional damage to the mold or crucible, or where the evaluated mold or crucible may be used for its intended purpose in an investment casting process. As provided herein, the systems and methods of the present disclosure are effective to perform non-destructive evaluation in a manner that measures the full volume geometry of the mold or crucible and/or that measures a desired portion or portions of the mold or crucible.

Figure 3A:
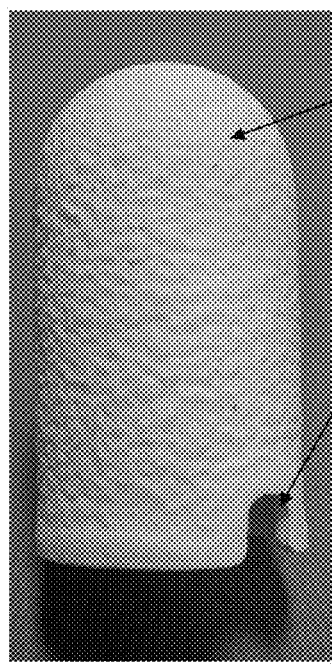
FIGS. 3A-3C are illustrations of various aspects of one embodiment of the system of the present disclosure and its use in the non-destructive evaluation of the wall thickness of a crucible.

In one embodiment, the support of the system further comprises a locating mechanism for positioning the mold or crucible in a repeatable orientation on the support and maintaining the mold or crucible in that orientation during scanning of the outer surface of the target region of the mold or crucible. As used herein, the term "locating mechanism" refers to any mechanical means for directing the placement of the mold or crucible on the support in a desired and repeatable orientation, and for keeping the mold or crucible in that same orientation for NDE purposes in accordance with the present disclosure. For example, in certain embodiments, a series of lugs can be used to define the area of the support where the crucible or mold is to be placed. For example, as shown in FIGS. 3A and 3C, in a particular embodiment, three lugs 26a and a crucible notch pin 26b can be used to orient and physically maintain the crucible on the support in a desired location and orientation. As shown in FIG. 3C, the crucible notch pin 26b fits into the notch 56 of the crucible in order to keep the crucible 50 from twisting or pivoting about the mount portion of the fixture of the support.

In a particular embodiment, the locating mechanism and the mount portion of the system are configured to work together to position the mold or crucible on the support in a manner that prevents or minimizes damage to the mold or crucible during the non-destructive evaluation. For example, the locating mechanism and mount portion can be configured so that the mold or crucible does not come into physical contact with the support, the locating mechanism, or the mount portion in any way that will damage the structure or function of the mold or crucible during NDE analysis using the system of the present disclosure.

In one embodiment, the fixture comprises a mount portion having a shape that conforms to an internal surface geometry (also referred to as "datum geometry") of a target region of the mold or crucible. In one embodiment, the mount portion of the fixture of the support has a surface geometry (e.g., 3D surface or surface roughness) and/or surface composition (e.g., materials and coatings used to make the surface of the mount portion) effective to minimize damage to any portion of and in particular the inner surface of the mold or crucible during mounting, maintaining, and/or removing of the mold or crucible to or from the support. In certain embodiments, the mount portion of the fixture can be made of or coated with a material that is known to minimize damage to the internal surface of the mold or crucible. Minimizing damage includes, for example, ensuring that no or substantially no marks, nicks, scratches, or the like are left behind on the locating surface of the ceramic geometry of the mold or crucible after undergoing NDE processing using a system and/or method according to the present disclosure. For certain investment casting applications, such marks, nicks, scratches, or the like of the mold or crucible may be considered as defects requiring the discarding of the part when they are larger than a particular size when measured in any dimension (e.g., larger than 0.5 mm in size as measured by length, width, and/or depth). Materials can be chosen to further reduce the size of potential defects to a more preferred specification (e.g., of less than 0.100 microns). In a particular embodiment, the act of securing and removing the mold or crucible (e.g., a ceramic shape) to the internal reference datum geometry (e.g., the mount portion of the fixture) should result in defects less than 50 microns in size. Suitable examples of materials for use in making the mount portion of the fixture can include, without limitation, silicone coatings, natural rubbers, acrylic paint coatings, plastic materials, and/or smoothly-polished metals.

In one embodiment of the system of the present disclosure, the 3D scanning device is fixed or not fixed to the support. In another embodiment of the system of the present disclosure, the 3D scanning device is operably connected to a robotic system for maneuvering the 3D scanning device during the scanning of the outer surface of the target region, or during scanning of the surface of the reference object. The 3D scanning device can include one or more 3D scanning heads. Further, the 3D scanning device can be any device effective to scan a surface in order to create a corresponding point cloud, polygonal structure, or non-uniform rational basis spline (NURBS) structure of that surface, which can be, without limitation, the outer surface of the target region of the mold or crucible or the surface of a reference object as used herein.

In various embodiments of the present disclosure, the 3D scanning device can operate in accordance with many different approaches for short-range, non-contact 3D scanning techniques. As is known by those of ordinary skill in the relevant art, a 3D scanner collects distance information about surfaces within its field-of-view (FOV).

There are three broad categories of 3D scanning techniques, namely, triangulation, structured light, and time-of-flight. Triangulation typically emits a laser light to determine the shape and position of the object. An offset camera is used to detect the reflected light. Geometry is used to calculate the distances. The baseline between the camera and the laser is known, and so is the angle of the laser. Structured light or white light 3D scanners also use triangulation. However, instead of using a laser it projects a pattern on the object. The whole FOV is captured at once, but several different patterns are projected in sequence over time. Each pixel in the camera will have a 3D location associated with it. Time-of-flight is typically used for larger objects. It uses a laser range finder and a means of moving the azimuth/elevation of the laser point. A pulse of light is timed to measure the distance to the object. When combined with the azimuth and elevation, it gives you the 3D location of the point. The laser it typically scanned with rotating mirrors to create a dense 3D point cloud.

The 3D scanning device of the present disclosure can include any scanning device effective for 3D scanning using triangulation, structure light (e.g., white light), and time-of-flight 3D scanning techniques. Thus, the 3D scanning device can include a structured light scanner (e.g., a white light scanner), a laser scanning device (e.g., laser scanner), or any other device effective for performing the 3D scanning techniques according to the present disclosure.

As provided herein, the 3D scanning device may be a laser scanning device. The laser scanning device can include, without limitation, a laser scanning head effective to generate a three-dimensional structure (e.g., a point cloud) of a scanned surface. In one embodiment, the laser scanning head can include, without limitation, a laser transceiver and a two-axis oscillating mirror. The laser scanning device can include a single laser scanning head or a plurality of laser scanning heads. Suitable examples of laser scanning devices for use in the system can include, without limitation, laser scanning devices made or sold by Konica Minolta (VIVID scanner), threeRivers 3D (Virtuoso scanner), Shape Drive (3D scanner), and the like. Those of ordinary skill in the art can readily determine other 3D scanning devices and 3D laser scanners for use in the system of the present disclosure.

As used herein, a suitable computer component can include any computer system (e.g., computer, software, peripherals, etc.) that can run the 3D scanning device and provide an output disposition with respect to a mold or crucible that has undergone an NDE process using the system or method of the present disclosure. Suitable computer components and computer systems for use in the systems and methods of the present disclosure are known by those of ordinary skill in the art.

In one embodiment, the computer component comprises a computer and software that, in an automated fashion, sends operation signals to the 3D scanning device, receives scanning data from the 3D scanning device, compares the received scanning data to desired mold or crucible specifications, and displays a disposition as to whether the mold or crucible has measurements that fall within or outside the desired structural integrity parameter range of the non-destructive evaluation, wherein the desired structural integrity parameter comprises measurement of full volume geometry or wall thickness of the mold or crucible. In a particular embodiment, the disposition provided by the computer component identifies the wall thickness as being either within or outside of the specification limits, thereby displaying whether the wall thickness has an accepted disposition or a rejected disposition.

In one embodiment, the computer component captures dimensions and tolerances specific to wall thickness, circularity, concentricity, and/or parallelism of the region of the mold or crucible undergoing NDE.

In another embodiment, the system further comprises a robotic apparatus for placing the mold or crucible on the support and for removing the mold or crucible from the support. In a particular embodiment, the robotic apparatus is effective to remove the non-destructively evaluated molds or crucibles from the support and segregate them into their respective collection areas according to whether they are identified as accepted (e.g., pass), rejected (e.g., fail), or rework dispositions. Suitable robotic apparatuses for use in the system of the present disclosure are known by those of ordinary skill in the art. Examples of suitable robotic apparatuses can include those manufactured or sold by Kuka Industrial Robots, Adept Technology, Inc., Staubli Robotics, ABB Robotics, etc.

Figure 2:
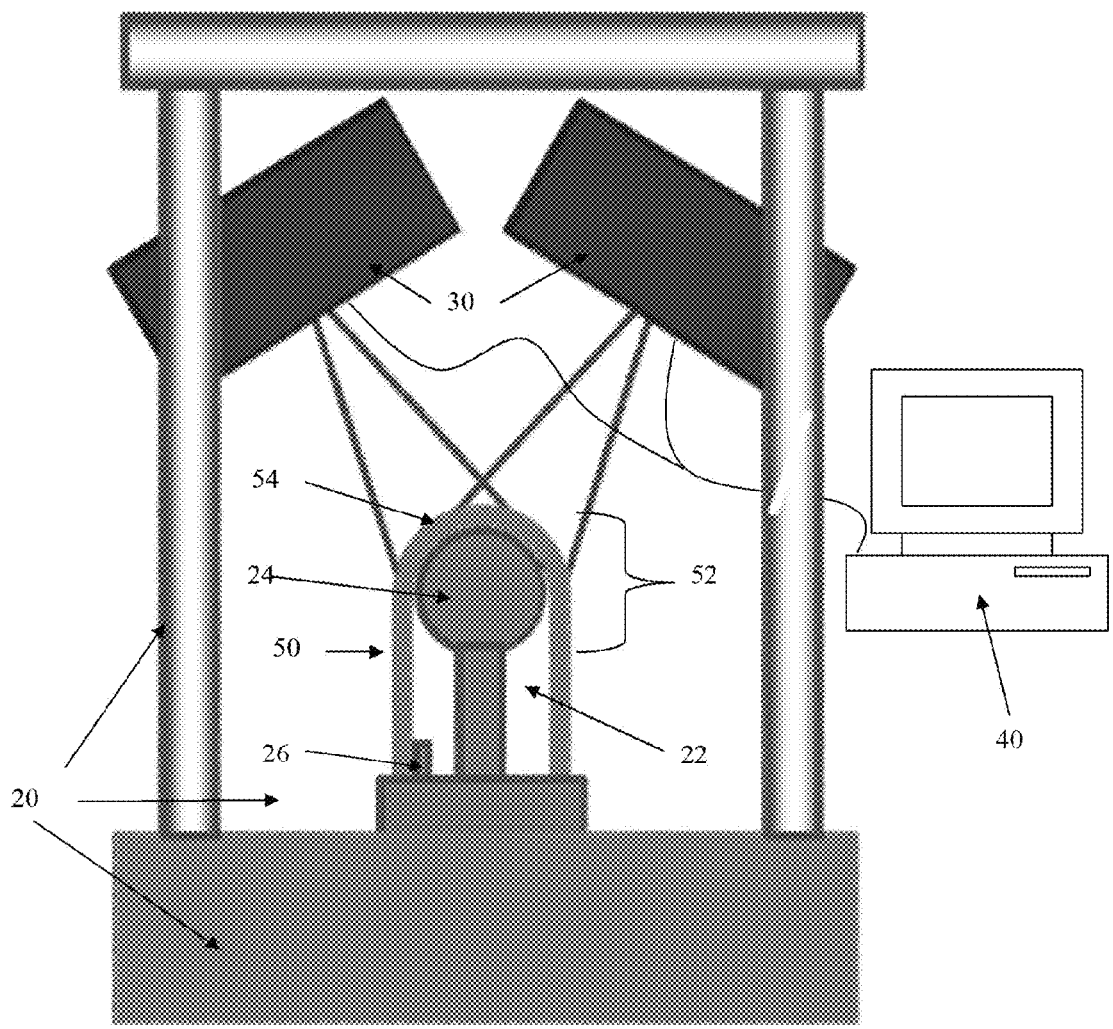
FIG. 2 is a schematic of one embodiment of a system for non-destructive evaluation (e.g., wall thickness) of a mold or crucible according to the present disclosure. The schematic shows the basic components of the embodiment, including a rigid support frame, two laser scanning heads, a central datum reference geometry (i.e., mount portion 24), and the geometry of interest (i.e., crucible 50). In the case of the figure a crucible 50 is shown for the geometry of interest, but this geometry may be of any type. Further, the system may comprise one or a plurality of laser scanning heads to perform the operation. Such details are to be determined by the geometry and quality requirements of the ceramic shell component of interest.

Illustrative examples of systems of the present disclosure are provided in FIG. 1 and FIG. 2, which are schematic diagrams of various embodiments of system 10 for non-destructive evaluation of a mold or crucible 50. As shown in FIGS. 1 and 2, system 10 includes a support 20, a 3D scanning device 30, and a computer component 40. Support 20 comprises a fixture 22 for securing a mold or crucible 50 of interest in place for non-destructive evaluation of mold or crucible 50. Fixture 22 comprises a mount portion 24 onto which mold or crucible 50 is secured. In certain embodiments, mount portion 24 has a shape that conforms to an internal surface geometry of a target region 52 of mold or crucible 50. Support 20 may further include locating mechanism 26 for positioning mold or crucible 50 in a repeatable orientation on support 20 and maintaining mold or crucible 50 in that orientation during scanning of outer surface 54 of target region 52 of mold or crucible 50. 3D scanning device 30 is used for scanning an outer surface 54 of target region 52 of mold or crucible 50 in order to generate a 3D structure (e.g., a point cloud) of scanned outer surface 54 of target region 52 of mold or crucible 50. The 3D scanning device may be fixed to the support (see FIG. 2) or may be independent from the support (see FIG. 1). The 3D scanning device may be a laser scanning device and include a single laser scanning head or a plurality of laser scanning heads. Computer component 40 is operably connected to 3D scanning device 30 and effective to create a difference map between the 3D structure (e.g., point cloud) of the scanned outer surface 54 of the target region 52 of mold or crucible 50 and the 3D structure of a reference object (e.g., a point cloud thereof) corresponding to an inner surface of a nominal model of the same target region of mold or crucible 50. The difference map indicates whether the mold or crucible falls within or outside a desired structural integrity parameter range.

Figure 3B:
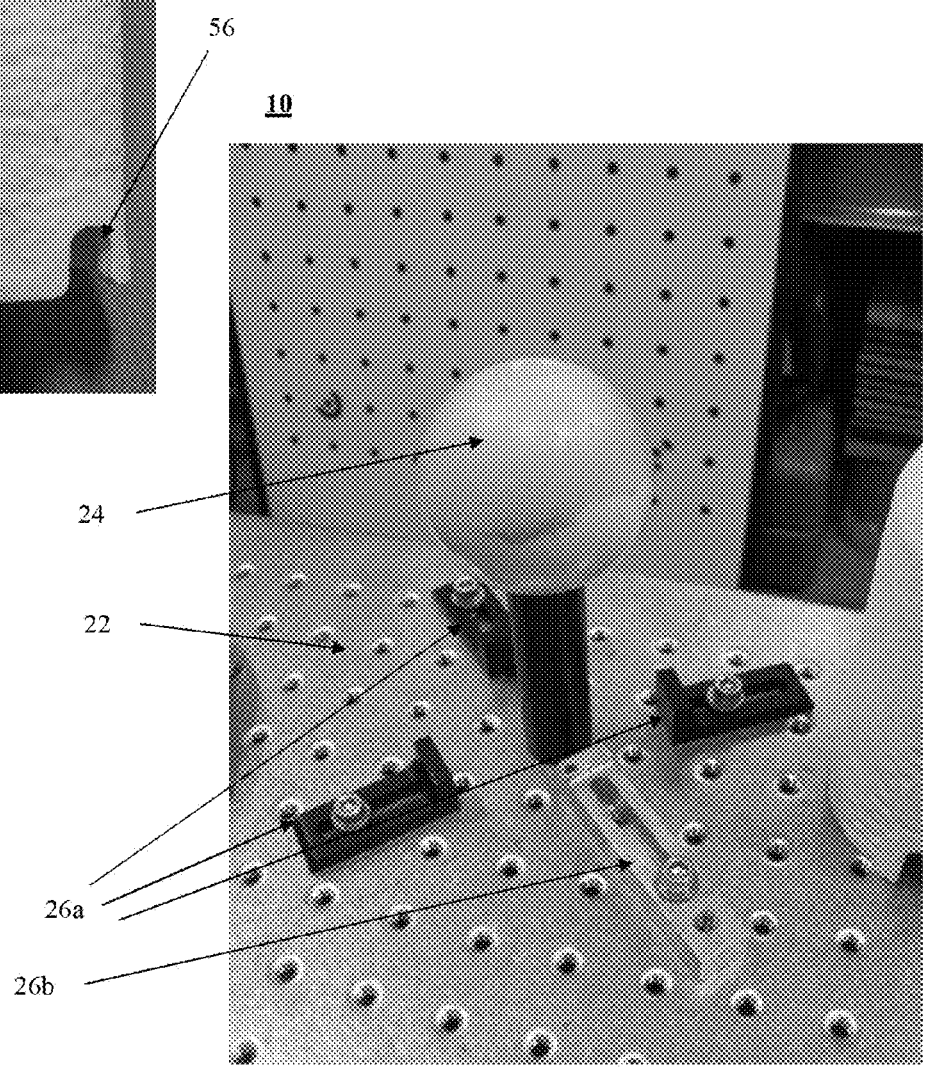
Figure 3C:
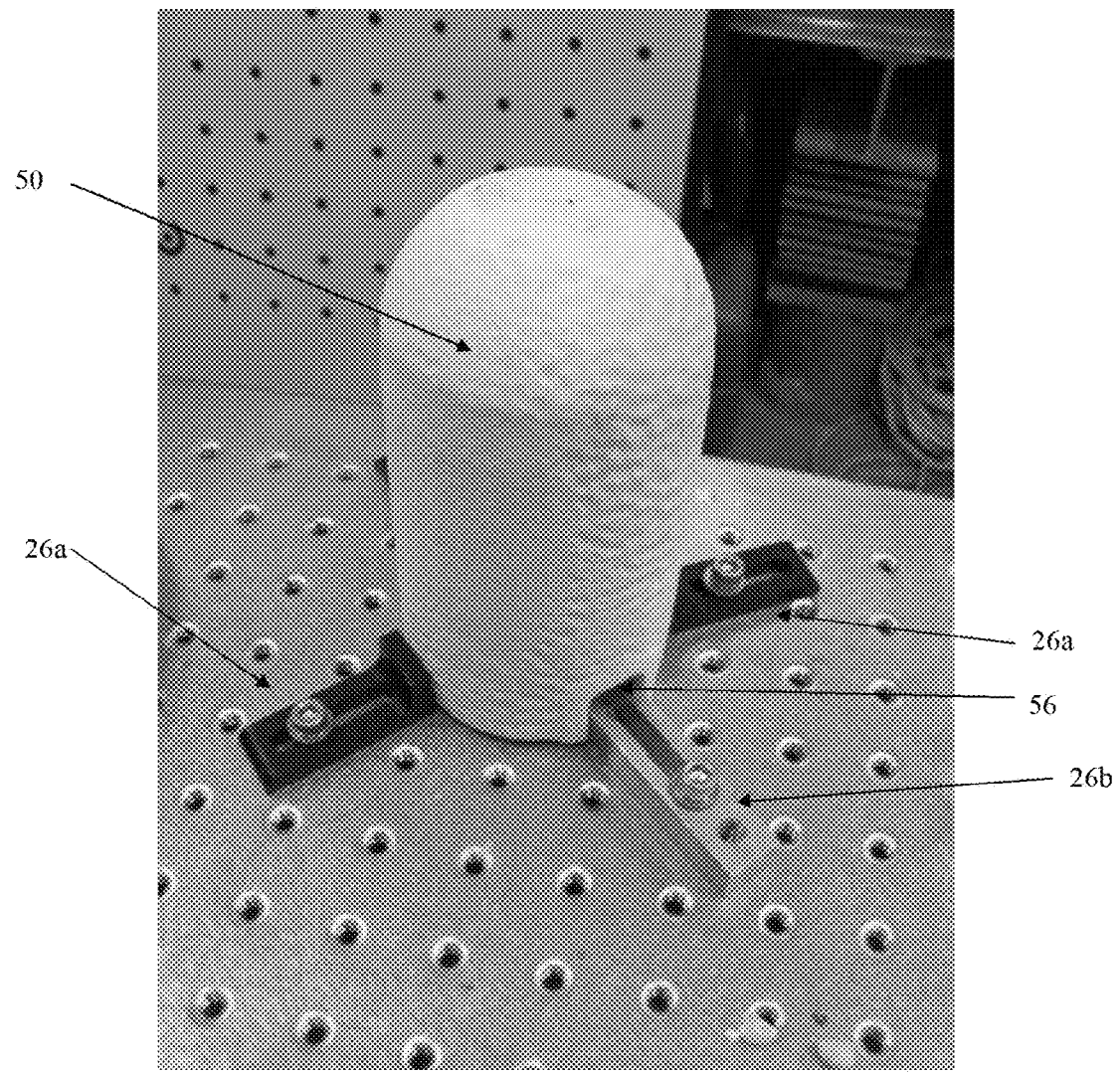

FIGS. 3A, 3B, and 3C are photographic images of one embodiment of system 10. In particular, FIGS. 3A, 3B, and 3C illustrate one embodiment of locating mechanism 26 (denoted as 26a and 26b) for positioning mold or crucible 50 in a repeatable orientation on support 20 and maintaining mold or crucible 50 in that orientation during scanning of the outer surface of the target region of mold or crucible 50, and more particularly for positioning mold or crucible 50 on mount portion 24. FIG. 3A shows crucible 50 prior to being secured to mount portion 24 of system 10. Crucible 50 is shown to include notch 56 (also referred to as a groove or door). FIG. 3B shows system 10 having mount portion 24 of fixture 22 and locating mechanism 26, with the locating mechanism being shown more particularly as locating mechanism lugs 26a and locating mechanism crucible notch pin 26b. FIG. 3C shows crucible 50 securely mounted on mount portion 24 and secured in place by locating mechanism 26, where locating mechanism lugs 26a orient the placed crucible 50 in the desired location and locating mechanism crucible notch pin 26b fits into crucible notch 56 in a manner that is effective to keep crucible 50 from rotating about the mount portion during NDE analysis. While three locating mechanism lugs are shown in FIG. 3B, the present disclosure is not limited to any particular number of such lugs. Thus, the present disclosure contemplates any mechanical means that can be used to orient and maintain the mold or crucible in a desired orientation and position on the support during NDE analysis according to the systems and methods of the present disclosure.

Method for Non-Destructive Evaluation of Molds and Crucibles

According to another aspect, the present disclosure provides a method for non-destructive evaluation of a mold or crucible. This method involves the steps of: providing a system for non-destructive evaluation according to the present disclosure; securing a mold or crucible to the support of the system; and operating the three-dimensional (3D) scanning device of the system in conjunction with the computer component of the system in order to create a 3D structure (e.g., a point cloud) difference map that indicates whether the mold or crucible falls within or outside a desired structural integrity parameter range. The 3D structure (e.g., point cloud) difference map shows deviations between a 3D structure (e.g., point cloud) generated by scanning an outer surface of a target region of the mold or crucible while secured on the support of the system and a 3D structure (e.g., point cloud) of a reference object corresponding to an inner surface of a nominal model of the same target region of the mold or crucible.

With regard to this method, the system for use in this method is as described in the present disclosure. Therefore, any embodiments, attributes, and/or other aspects of the system that are not reiterated with respect to the method are hereby incorporated by reference herein.

According to one embodiment of the method of the present disclosure, the mold or crucible is determined to have either: (i) an acceptable disposition if at least between about 75 and about 90 percent of the difference map falls within the desired structural integrity parameter range; (ii) a rejected disposition if more than between about 10 and about 25 percent of the difference map falls below the desired structural parameter range; or (iii) a rework disposition if more than between about 10 and about 25 percent of the difference map falls above the desired structural parameter range.

As noted herein, the method can involve using the system of the present disclosure to determine whether the mold or crucible falls within or outside of a desired structural integrity parameter, e.g., wall thickness of a portion or all of the mold or crucible. The method can be used for non-destructive evaluation that involves measuring full volume geometry of the mold or crucible. As an illustrative example, the desired structural integrity parameter can be wall thickness of the dome of a crucible, where the wall thickness is desired to be within a particular thickness range in millimeters. If the crucible is found to fall within the desired thickness range, then it is determined to have an accepted disposition, and therefore can be used as is. If the crucible is found to fall below the desired thickness range, then it is determined to have a rejected disposition because it is too thin for its intended purpose (e.g., investment casting processes), and therefore should be discarded and not used. If the crucible is found to fall above the desired thickness range, then it is determined either to have a rejected disposition or a rework disposition. A rework disposition can mean that, while a portion of the crucible may be too thick, that portion could be reworked (e.g., ground) to bring it within the desired thickness range.

In certain embodiments, the method uses a structural integrity parameter that is effective to determine the amount of stress that the mold or crucible will be able to withstand during a particular investment casting process. For example, in one embodiment, the structural integrity parameter can be one that identifies molds or crucibles that have a yield strength of up to 200 Mega Pascal (MPa). Therefore, the system of the present disclosure is effective for stress management of molds or crucibles used in investment casting processes.

Figure 15:
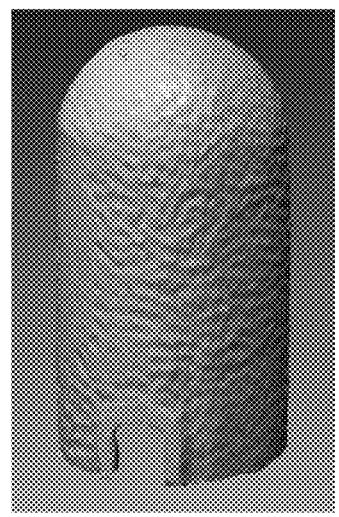
FIG. 15 is a nominal model of a crucible according to one embodiment of the present disclosure. The nominal model can be constructed from point cloud data.

In one embodiment, the nominal model can be generated using algorithms for surface modeling based on the point cloud data, or derived from 3D solid models based on engineering specifications. An example of a nominal model in accordance with the present disclosure is shown in FIG. 15.

In various embodiments, the method involves operating the computer component's control software in order to calculate the wall thickness of the mold or crucible using the reference datum geometry scan, nominal model, and actual geometry point cloud data.

In one embodiment, the support of the system further comprises a locating mechanism for positioning the mold or crucible in a repeatable orientation on the support and maintaining the mold or crucible in that orientation during scanning of the outer surface of the target region of the mold or crucible. In various embodiments, the mount portion of the fixture can have a surface geometry and/or surface composition effective to prevent or minimize damage to the inner surface of the mold or crucible during mounting, maintaining, and/or removing the mold or crucible to or from the support.

In one embodiment, the step of securing the mold or crucible to the support of the system comprises: (i) providing a support whose locating mechanism and mount portion are configured to work together to position the mold or crucible on the support in a manner that prevents or minimizes damage to the mold or crucible during the non-destructive evaluation; and (ii) securing the mold or crucible in place on the support so that the inner surface of the mold or crucible has a desired contact with the mount portion of the fixture. In a particular embodiment, the desired contact is based on location of contact and amount of contact, wherein the amount of contact ranges from no contact to full contact with the mount portion of the fixture.

In one embodiment of the method of the present disclosure, the step of operating the 3D scanning device in conjunction with the computer component comprises using the computer component to execute the following steps in an automated fashion, the steps comprising: (i) sending operation signals to the 3D scanning device; (ii) receiving scanning data from the 3D scanning device; (iii) comparing the received scanning data to desired mold or crucible specifications; and (iv) displaying a disposition as to whether the mold or crucible has measurements that fall within or outside the desired structural integrity parameter of the non-destructive evaluation, wherein the desired structural integrity parameter comprises measurement of full volume geometry or wall thickness of the mold or crucible.

In one embodiment, the step of sending operation signals to the 3D scanning device comprises: (i) directing the 3D scanning device to scan the surface of the reference object to produce the initial datum geometry reference scan prior to securing the mold or crucible in place on the support; (ii) directing the 3D scanning device to scan the outer surface of the target region of the mold or crucible to generate a corresponding 3D structure (e.g., point cloud) of the target region; or (iii) directing the 3D scanning device to scan the surface of the reference object to produce the initial datum geometry reference scan prior to securing the mold or crucible in place on the support, and thereafter to scan the outer surface of the target region of the mold or crucible to generate the corresponding 3D structure (e.g., point cloud) when the mold or crucible is in place on the support.

In one embodiment, the method involves performing best-fit and other mathematical calculations using a 3D nominal CAD model to orient the scanning data. In one embodiment, the disposition provided by the computer component identifies the full volume geometry and/or the wall thickness of the mold or crucible as being either within or outside of the specification limits, thereby displaying whether the full volume geometry or wall thickness of the mold or crucible has an accepted disposition, a rejected disposition, or a rework disposition.

In one embodiment, the step of operating the 3D scanning device in conjunction with the computer component of the system in order to create the 3D structure difference map comprises the following steps: using the 3D scanning device of the system or a different 3D scanning device to scan the surface of the reference object to generate the 3D structure of the reference object; using the 3D scanning device of the system to scan the outer surface of the target region of the mold or crucible to generate the 3D structure of said target region; and using the computer component to create the 3D structure difference map to determine whether the mold or crucible fails within or outside of the desired structural integrity parameter range. In a particular embodiment, the reference object comprises either the mount portion of the fixture or a fugitive pattern of the mold or crucible (e.g., a wax mold or crucible).

In one embodiment, the step of operating the 3D scanning device in conjunction with the computer component of the system in order to create the 3D structure difference map comprises the following steps: providing a computer aided design (CAD) model of the inner surface of a nominal model of the mold or crucible; using the 3D scanning device of the system to scan the outer surface of the target region of the mold or crucible to generate the 3D structure of said target region; and using the computer component to create the 3D structure difference map to determine whether the mold or crucible fails within or outside of the desired structural integrity parameter range.

In one embodiment, the method is performed on a plurality of different molds or crucibles using the same 3D structure of the reference object.

In another embodiment, the method further involves using a robotic apparatus for placing the mold or crucible on the support and for removing the mold or crucible from the support. In certain embodiments, the robotic apparatus is programmed to automatically place the molds or crucibles into segregated locations according to their dispositions as either accepted, rejected, or rework, after having undergone NDE analysis according to the method of the present disclosure.

Figure 4:
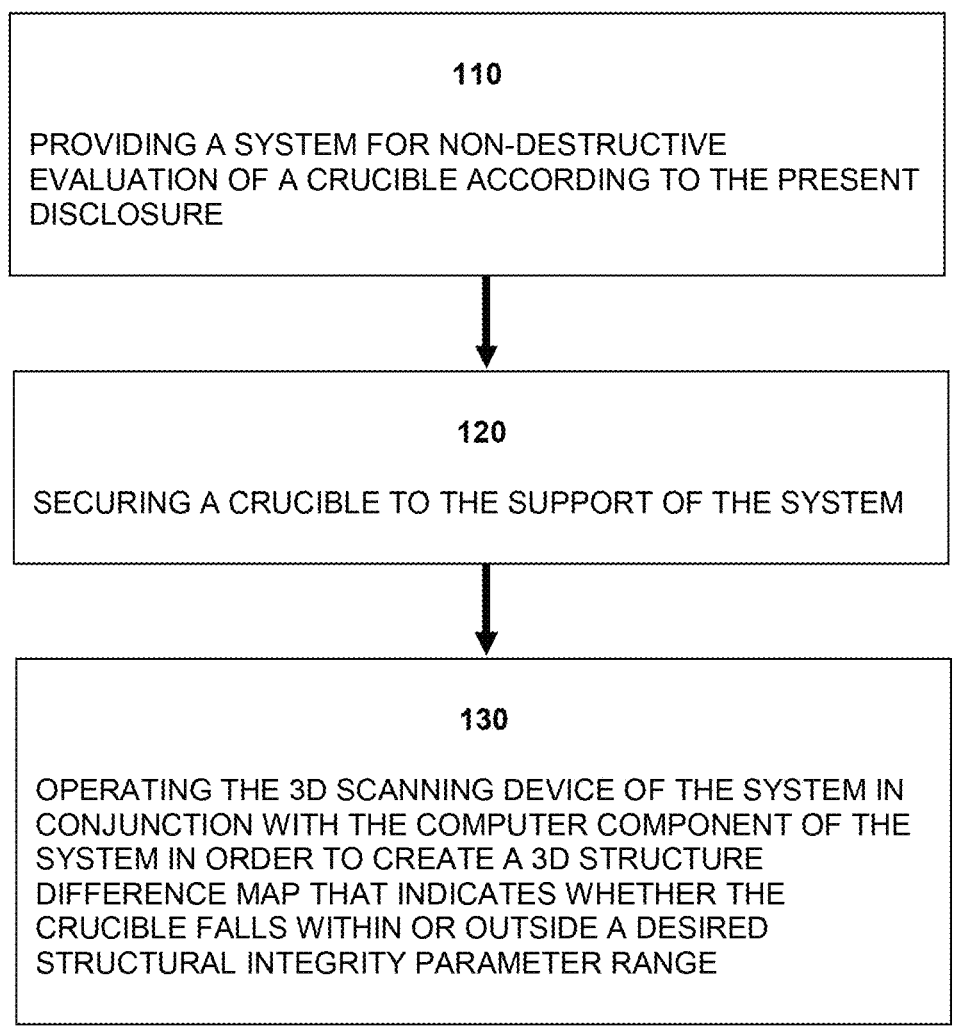
FIG. 4 is a flowchart illustrating one embodiment of a method for non-destructive evaluation of a crucible according to the present disclosure.
Figure 5:
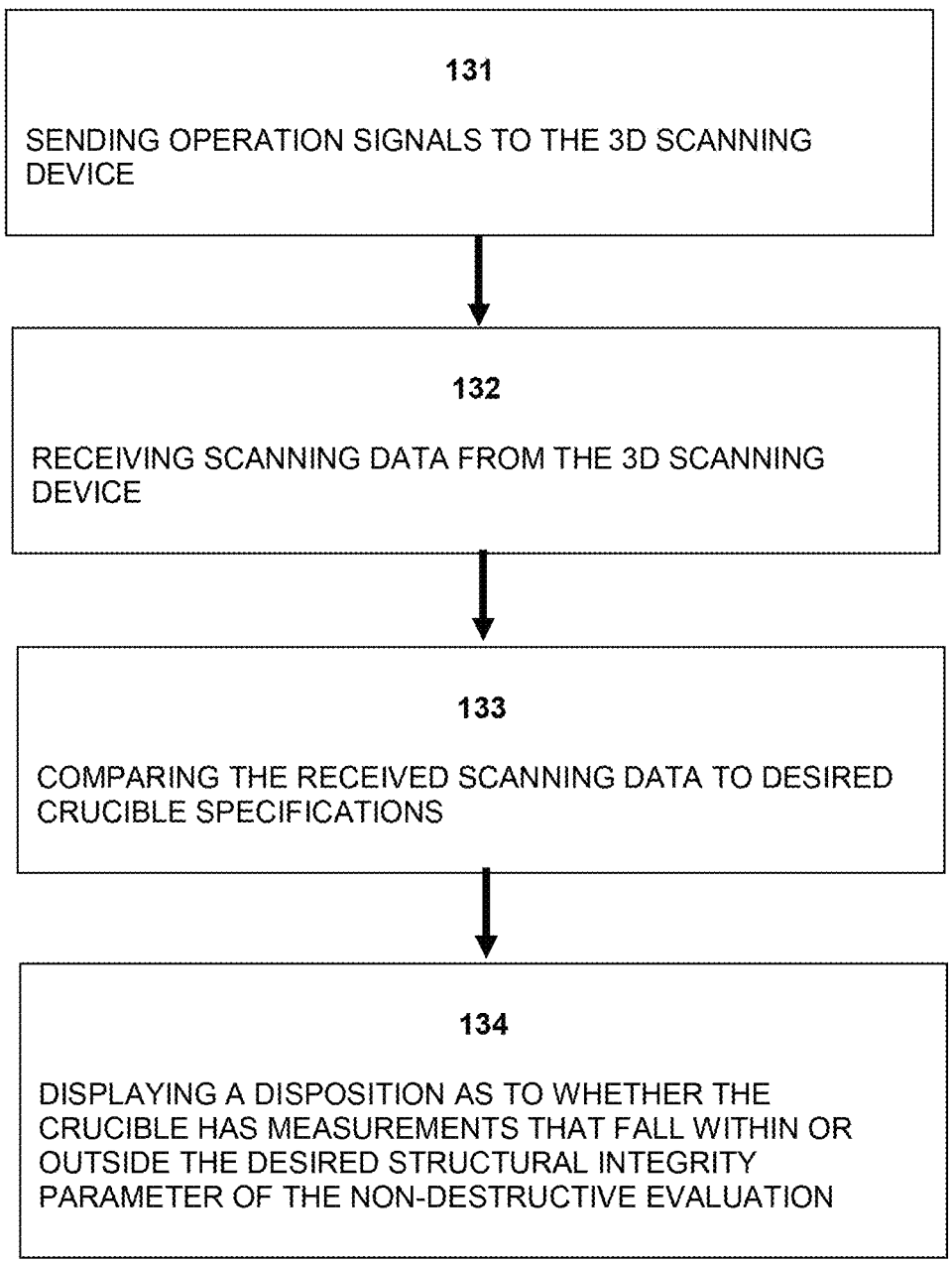
FIG. 5 is a flowchart illustrating one embodiment of the step of operating the 3D scanning device of the system of the present disclosure in conjunction with the computer component in order to determine structural integrity of the crucible.

FIG. 4 and FIG. 5 illustrate embodiments of various aspects of the methods of the present disclosure for non-destructive evaluation of a crucible.

FIG. 4 is a flowchart illustrating one embodiment of method 100 for non-destructive evaluation of a crucible. As shown in FIG. 4, method 100 includes the steps of: providing a system for non-destructive evaluation of a crucible according to the present disclosure (step 110); securing a crucible to the support of the system (step 120); and operating the 3D scanning device of the system in conjunction with the computer component of the system in order to create a 3D structure (e.g., point cloud) difference map that indicates whether the crucible falls within or outside a desired structural integrity parameter range (step 130). In order to position the crucible in a repeatable orientation on the support, the support can include a locating mechanism as described herein. As discussed previously, the system of the present disclosure that is used in this method is effective to measure full volume wall thickness of the crucible.

As shown in the flowchart of FIG. 5, in one embodiment of method 100, operating the 3D scanning device with the computer component (step 130) comprises the following: sending operation signals to the 3D scanning device (step 131); receiving scanning data from the 3D scanning device (step 132); comparing the received scanning data to desired crucible specifications (step 133); and displaying a disposition as to whether the crucible has measurements that fall within or outside the desired structural integrity parameter of the non-destructive evaluation (step 134), wherein the desired structural integrity parameter comprises measurement of full volume geometry or wall thickness of the crucible.

Figure 6:
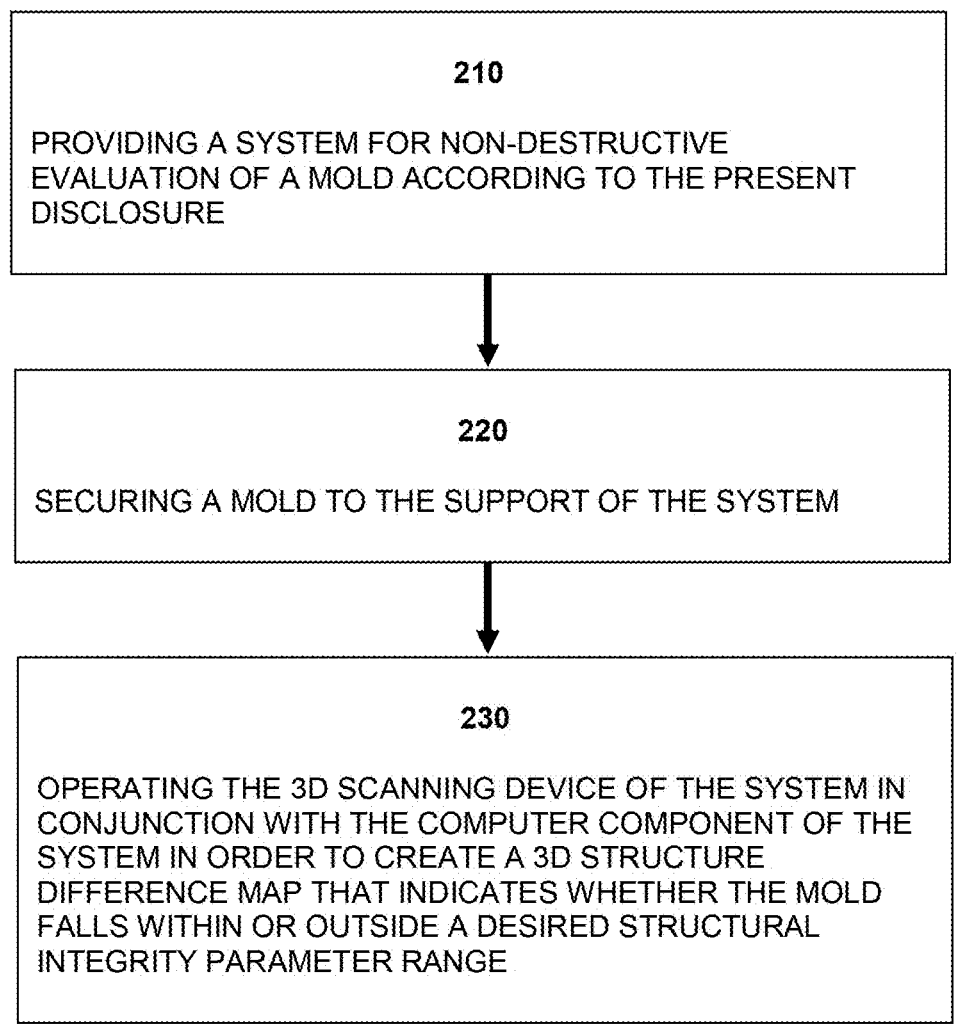
FIG. 6 is a flowchart illustrating one embodiment of a method for non-destructive evaluation of a mold according to the present disclosure.
Figure 7:
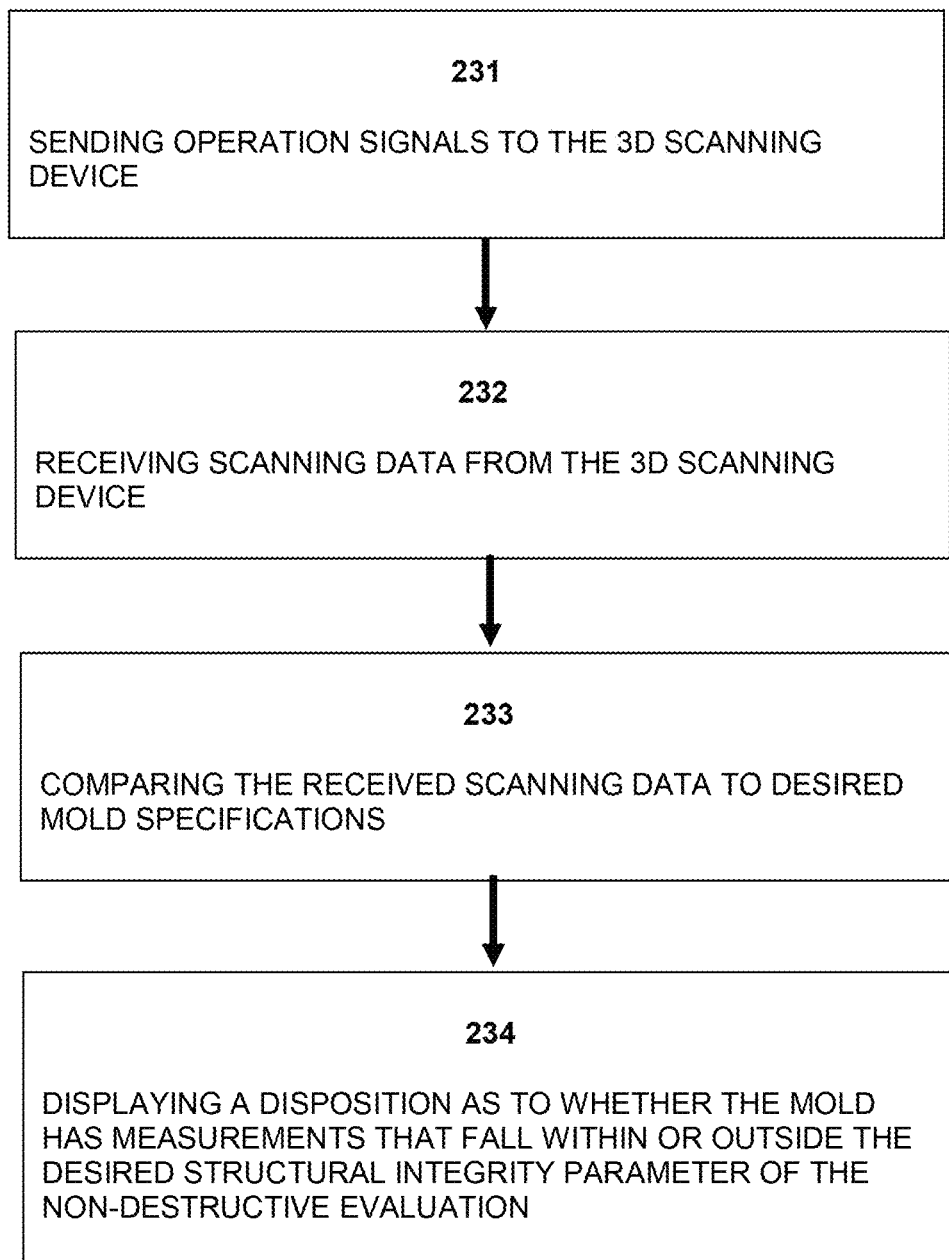
FIG. 7 is a flowchart illustrating one embodiment of the step of operating the 3D scanning device of the system of the present disclosure in conjunction with the computer component in order to determine structural integrity of the mold.
Figures 9A, 9B, 9C, 9D:
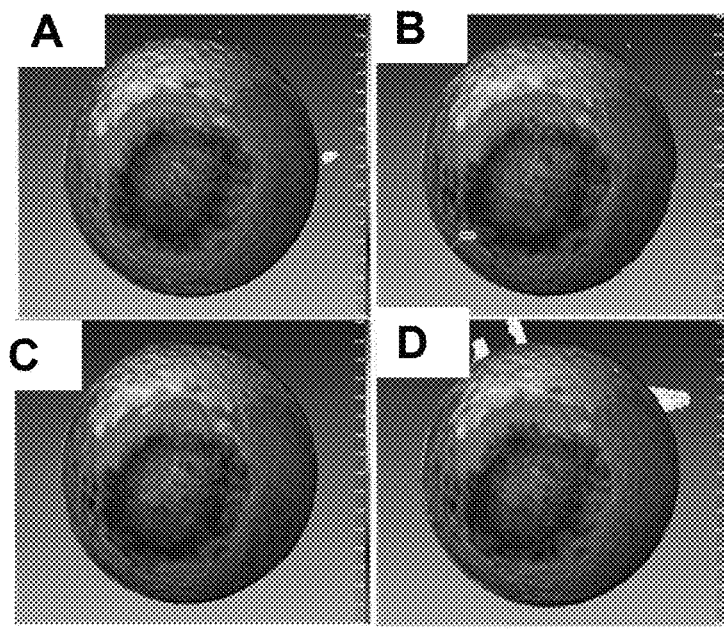
FIGS. 9A-9D are illustrations of crucible scans produced in accordance with embodiments of the system and method of the present disclosure showing the repeatability of the scan. This type of inspection shows an example of a calibration routine which would be employed at the start of using the system, and to set initial limits on the repeatability and thus statistical certainty of the measurements.

FIG. 6 and FIG. 7 illustrate embodiments of various aspects of the methods of the present disclosure for non-destructive evaluation of a mold. In these embodiments, a wax is used to establish the inner surface geometry of the desired mold.

FIG. 6 is a flowchart illustrating one embodiment of method 200 for non-destructive evaluation of a mold. As shown in FIG. 6, method 200 includes: providing a system for non-destructive evaluation of a mold according to the present disclosure (step 210); securing a mold to the support of the system (step 220); and operating the 3D scanning device of the system in conjunction with the computer component of the system in order to create a 3D structure (e.g., point cloud) difference map that indicates whether the mold falls within or outside a desired structural integrity parameter range (step 230). In order to position the mold in a repeatable orientation on the support, the support can include a locating mechanism as described herein. As discussed previously, the system of the present disclosure that is used in this method is effective to measure full volume wall thickness of the mold.

As shown in the flowchart of FIG. 7, in one embodiment of method 200, operating the 3D scanning device with the computer component (step 230) comprises the following: sending operation signals to the 3D scanning device (step 231); receiving scanning data from the 3D scanning device (step 232); comparing the received scanning data to desired mold specifications (step 233); and displaying a disposition as to whether the mold has measurements that fall within or outside the desired structural integrity parameter of the non-destructive evaluation (step 234), wherein the desired structural integrity parameter comprises measurement of full volume geometry or wall thickness of the mold.

In one embodiment of the method of the present disclosure, the disposition provided by the computer component identifies the wall thickness as being either within or outside of the specification limits, thereby displaying whether the wall thickness has an accepted disposition or a rejected disposition.

In one embodiment of the method of the present disclosure, the computer component captures dimensions and tolerances specific to wall thickness, circularity, concentricity, and/or parallelism of the region of the mold or crucible.

EXAMPLES

The following examples are intended to illustrate particular embodiments, but are by no means intended to limit the scope of the present systems and techniques.

Example 1

In one embodiment, the system of the present disclosure includes one or a plurality of laser scanning heads, a rigid frame stand to hold the scanning head which may include mechatronic motion of the scanning head, a fixture to locate the inspected part, and an inspection logging and decisioning computer. The laser scanning head works by means of a typical commercial off-the-shelf scanning head, which consists of a laser transceiver and a two-axis oscillating mirror. When mapped over polar positions of the mirror by governing software, a point cloud is generated which corresponds to a mapping of the measured surface. Multiple laser scanning heads may be employed to increase the point density and thus accuracy of the measurement. The inspection and logging decisioning computer includes a control computer and software that sends operation signals to the scanning unit, receives scanning data from the unit, compares the data to part specifications, and displays a disposition in an automated fashion. The computer may be PC-based or any other simple computing machine. The software compares the point cloud of the measured external surface and creates a difference map between the measured external surface point cloud and a known nominal shape (in the software's 3D space) representing the geometry of the crucible, and specifically the internal geometry of the dome of the crucible. The difference map provides a mapping of the crucible wall thickness of the dome of the crucible.

As shown in FIGS. 8A-8E, thickness acceptability is represented as a 3D surface map wherein the surfaces are color-coded or otherwise marked based on disposition. For example, as shown in FIGS. 8A-8E, an accepted wall thickness can shown in green (denoted as reference number 42 in FIGS. 8A-8E), a rejected wall thickness can be shown in red (denoted as reference number 44 in FIGS. 8A, 8B, 8C, and 8E), and a rework wall thickness (i.e., greater thickness than accepted thicknesses) can be shown in blue (not shown in the figures). Thus, when the wall thickness is below lower specification limits, the software shows the surface in color-coded red (shown in FIGS. 8A, 8B, 8C, and 8E as reference numbers 44) to denote that the thickness is below minimum specifications. If the thickness is above maximum limits, the surface is color-coded blue to denote that a rework operation is needed. To determine overall part disposition, a threshold minimum surface area is chosen. Typically this figure is 20 percent for regions of the crucible that are not highly stressed during melting. This means that if more than 20 percent of the measured surface area is below minimum thickness, the software triggers a Reject disposition. If more than this threshold percentage (or another threshold percentage for upper limits) is above maximum thickness, a Rework disposition is reported. Otherwise, an Accept disposition is reported.

The rigid fixture consists of a smooth geometry that closely fits the internal geometry of the dome of the inspected crucible, and is of a shape, surface finish, and hardness that is selected to ensure minimum damage of the internal surface of the dome of the crucible during the measurement operation. The geometry of the dome of the crucible may be ball or spheroidal-shaped, or any other shape appropriate to fit tightly into the dome of the crucible part without damage. To further minimize damage to the internal surface, the spheroidal insert may be coated with paint, polymer coating, a high durometer rubber, or similar soft material. The fixture also consists of locating geometry to ensure the crucible part is oriented in a repeatable position (see FIGS. 9A-9D). FIGS. 9A-9D show different scans of the same crucible where the crucible is removed and reinstalled and then scanned/rescanned. As shown in FIGS. 9A-9D, the scans are virtually identical.

The frame includes mechanical pieces including structural members and a table (steel or granite) to hold the laser scanning head in a precise fixed position from the fixture, with optional provisions for vibration reduction. Linear motion components such as ball screws and servo motors may be included to provide precise positioning of the laser scanning head(s).

Example 2

Figure 10A:
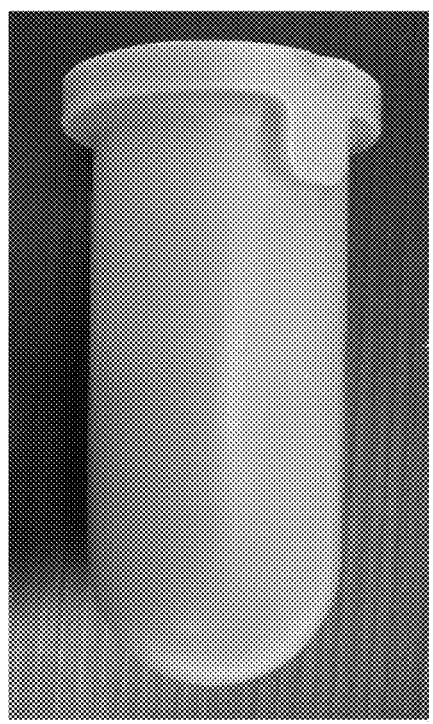
FIGS. 10A-10B are images of crucible waxes (also referred to generally as fugitive patterns) used as nominal models for non-destructive evaluation of a crucible using embodiments of a system or method of the present disclosure. The outer surface scan of the crucible wax nominal model can be subtracted from the outer surface scan of a crucible to calculate the wall thickness of the crucible.
Figure 10B:
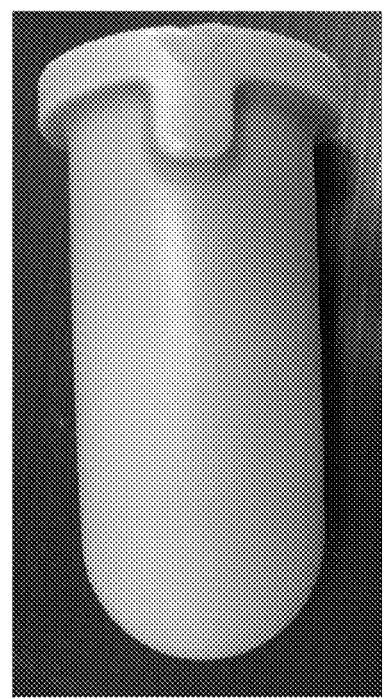

In a second embodiment, the system of the present disclosure includes one or a plurality of laser scanning heads, a rigid frame stand to hold the scanning head which may include mechatronic motion of the scanning head, a fixture to locate the inspected part, and an inspection logging and decisioning computer. The laser scanning head works by means of a typical commercial off-the-shelf scanning head, which consists of a laser transceiver and a two-axis oscillating mirror, as described in the previous example. When mapped over polar positions of the mirror by governing software, a point cloud is generated which corresponds to a mapping of the measured surface. Multiple laser scanning heads may be employed to increase the point density and thus accuracy of the measurement. In this example the system is used to measure the wall thickness of both the dome section and the straight wall sections of the crucible. A wax pattern is used to measure a point cloud of the internal surface of both the dome section and the straight wall sections of the crucible. A 3-D surface model is then generated of the external surface of the crucible, and this model is then used as a representation of the internal surface of resulting crucible. Photographs of a suitable crucible wax patterns are shown in FIGS. 10A-10B. The same wax pattern, or an equivalent wax pattern, is used to produce the crucible by a previously disclosed slurry-dip process, or a similar process.

The inspection and logging decisioning computer includes a control computer and software that sends operation signals to the scanning unit, receives scanning data from the unit, compares the data to part specifications, and displays a disposition in an automated fashion. The computer may be PC-based or any other simple computing machine. The software compares the point cloud of the measured external surface against the model that was generated of the external surface of the wax, which is used as a representation of the internal surface of the resulting crucible and a difference map is generated between the measured external surface point cloud and the model of the internal surface of the crucible. The difference map corresponds to a mapping of the crucible wall thickness in the dome of the crucible.

When the wall thickness is below lower specification limits, the software triggers a Reject disposition. If the thickness is within upper and lower specification limits, the software triggers an Accept disposition. If the thickness is above the upper specification limit, a Rework disposition is reported. The fixture also consists of locating geometry to ensure the crucible part is oriented in a repeatable position.

Example 3

Figure 11:
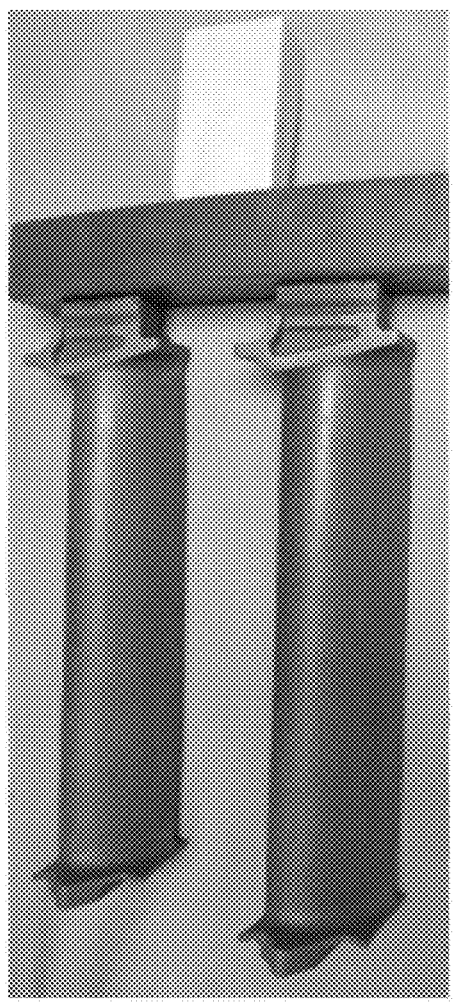
FIG. 11 is an image of a wax assembly with two blade waxes (also referred to generally as fugitive patterns) to make a mold with two cavities feed channels and a pour cup to cast two blades. The outer surface scan of the wax assembly can be subtracted from the outer surface scan of a mold to calculate the wall thickness of the mold.

In a third embodiment, the system of the present disclosure includes one or a plurality of laser scanning heads, a rigid frame stand to hold the scanning head which may include mechatronic motion of the scanning head, a fixture to locate the inspected part, and an inspection logging and decisioning computer. The laser scanning head works by means of a typical commercial off-the-shelf scanning head, which consists of a laser transceiver and a two-axis oscillating mirror, as described in the previous example. In this example the system is used to measure the wall thickness of a mold. The starting point for determining the mold wall thickness is the wax pattern assembly that is used to generate the mold. The laser scanner, as described in the previous examples, is used to generate a point cloud which corresponds to an initial mapping of the measured external surface of the wax pattern. Subsequently, a point cloud is generated which corresponds to a mapping of the measured external surface of the mold built from the wax pattern. Multiple laser scanning heads may be employed to increase the point density and thus accuracy of the measurement. A 3-D surface model is generated from the point cloud of the external surface of the mold wax assembly, and this surface model is then used as a representation of the internal surface of the resulting mold wax assembly. Photographs of a typical wax pattern assembly used to make a mold is shown in FIG. 11. The same wax pattern, or an equivalent wax pattern, is used to produce the mold by a previously disclosed slurry-dip process, or a similar process.

The inspection and logging decisioning computer includes a control computer and software that sends operation signals to the scanning unit, receives scanning data from the unit, compares the data to part specifications, and displays a disposition in an automated fashion. The computer may be PC-based or any other simple computing machine. The software compares the point cloud of the measured external surface of the mold against the 3-D surface model that was generated from the external surface of the wax, which is used as a representation of the internal surface of the resulting mold, and a difference map is generated between the measured external surface point cloud and the model of the internal surface of the mold. The difference map corresponds to a mapping of the mold wall thickness.

When the wall thickness is below lower specification limits, the software triggers a Reject disposition. If the wall thickness of the mold is within upper and lower specification limits, the software triggers an Accept disposition. If the thickness is below the lower specification limit or above the upper specification limit, the mold is rejected because it will not make a satisfactory component. For example, if the mold is too thin, it can break during casting and cause a mold leak and casting failure. If the mold is too thick, it can cause cracking of the part during post solidification cool down due to differential thermal expansion mismatch between the mold and component. The fixture can contain a locating geometry to ensure the mold part is oriented in a repeatable position.

Although various embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed is:

1. A method for non-destructive evaluation of a mold or crucible, said method comprising:
   providing a system for non-destructive evaluation comprising
      a support comprising a fixture for securing a ceramic or refractory oxide mold or crucible in place for non-destructive evaluation, said fixture comprising a mount portion onto which the ceramic or refractory oxide mold or crucible is secured;
      a three-dimensional (3D) scanning device for scanning an outer surface of a target region of the ceramic or refractory oxide mold or crucible in order to generate a 3D structure of the scanned outer surface of the target region; and
      a computer component operably connected to the 3D scanning device and effective to create a difference map between the 3D structure of the scanned outer surface of the target region of the ceramic or refractory oxide mold or crucible and a 3D structure of a reference object corresponding, to an inner surface of a nominal model of the same target region of the ceramic or refractory oxide mold or crucible,
      wherein said difference map indicates whether the ceramic or refractory oxide mold or crucible falls within or outside a desired structural integrity parameter range;
   securing the mold or crucible to the support of the system; and
   operating the three-dimensional (3D) scanning device in conjunction with the computer component of the system in order to create a 3D structure difference map that indicates whether the mold or crucible falls within or outside a desired structural integrity parameter range, wherein the 3D structure difference map shows deviations between a 3D structure generated by scanning an outer surface of a target region of the mold or crucible while secured on the support of the system and a 3D structure of a reference object corresponding to an inner surface of a nominal model of the same target region of the mold or crucible, wherein the mold or crucible is determined to have either:
      an acceptable disposition if at least between about 75 and about 90 percent of the difference map falls within the desired structural integrity parameter range;
      a rejected disposition if more than between about 10 and about 25 percent of the difference map falls below the desired structural parameter range; or
      a rework disposition if more than between about 10 and about 25 percent of the difference map falls above the desired structural parameter range.

2. A method for non-destructive evaluation of a mold or crucible, said method comprising the steps of:
   providing a system for non-destructive evaluation comprising
      a support comprising a fixture for securing a ceramic or refractory oxide mold or crucible in place for non-destructive evaluation, said fixture comprising a mount portion onto which the ceramic or refractory oxide mold or crucible is secured;
      a three-dimensional (3D) scanning device for scanning an outer surface of a target region of the ceramic or refractory oxide mold or crucible in order to generate a 3D structure of the scanned outer surface of the target region; and a computer component operably connected to the 3D scanning device and effective to create a difference map between the 3D structure of the scanned outer surface of the target region of the ceramic or refractory oxide mold or crucible and a 3D structure of a reference object corresponding to an inner surface of a nominal model of the same target region of the ceramic or refractory oxide mold or crucible, wherein said difference map indicates whether the ceramic or refractory oxide mold or crucible falls within or outside a desired structural integrity parameter range;

securing the mold or crucible to the support of the system; and operating the three-dimensional (3D) scanning device in conjunction with the computer component of the system in order to create a 3D structure difference map that indicates whether the mold or crucible falls within or outside a desired structural integrity parameter range, wherein the 3D structure difference map shows deviations between a 3D structure generated by scanning an outer surface of a target region of the mold or crucible while secured on the support of the system and a 3D structure of a reference object corresponding to an inner surface of a nominal model of the same target region of the mold or crucible, wherein the method is performed on a plurality of different molds or crucibles using the same 3D structure of the reference object.

* * * * *